United States Patent
Nunotani et al.

(10) Patent No.: US 9,444,017 B2
(45) Date of Patent: Sep. 13, 2016

(54) SEMICONDUCTOR LIGHT EMITTING DEVICE WITH A FILM HAVING A ROUGHENED SURFACE

(71) Applicant: Kabushiki Kaisha Toshiba, Minato-ku, Tokyo (JP)

(72) Inventors: Shinji Nunotani, Kanazawa Ishikawa (JP); Kazuo Fujimura, Kanazawa Ishikawa (JP); Shinya Ito, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/481,189

(22) Filed: Sep. 9, 2014

(65) Prior Publication Data

US 2015/0280072 A1    Oct. 1, 2015

(30) Foreign Application Priority Data

Mar. 27, 2014   (JP) .................................. 2014-065820

(51) Int. Cl.

| | |
|---|---|
| H01L 33/22 | (2010.01) |
| H01L 33/54 | (2010.01) |
| H01L 33/40 | (2010.01) |
| H01L 33/56 | (2010.01) |
| H01L 33/60 | (2010.01) |
| H01L 33/62 | (2010.01) |
| H01L 33/48 | (2010.01) |
| H01L 33/50 | (2010.01) |

(52) U.S. Cl.
CPC ........... *H01L 33/405* (2013.01); *H01L 33/486* (2013.01); *H01L 33/56* (2013.01); *H01L 33/60* (2013.01); *H01L 33/62* (2013.01); *H01L 33/22* (2013.01); *H01L 33/504* (2013.01); *H01L 2933/0091* (2013.01)

(58) Field of Classification Search
CPC .......... H01L 33/00–33/648; H01L 2933/0091
See application file for complete search history.

(56) References Cited

U.S. PATENT DOCUMENTS

| | | | |
|---|---|---|---|
| 8,351,119 B2 * | 1/2013 | Yang ..................... | G02B 5/0221 359/599 |
| 8,481,863 B2 | 7/2013 | Shiraishi et al. | |
| 2010/0140640 A1 * | 6/2010 | Shimokawa ........ | H01L 33/0079 257/98 |
| 2011/0186813 A1 * | 8/2011 | Kim ........................ | H01L 33/44 257/13 |

(Continued)

FOREIGN PATENT DOCUMENTS

| | | |
|---|---|---|
| JP | 2000-244012 A | 9/2000 |
| JP | 2009-147352 A | 7/2009 |

(Continued)

OTHER PUBLICATIONS

Taiwanese Office Action issued on Nov. 23, 2015 in counterpart Taiwanese patent application No. 103122148 and English translation thereof.

*Primary Examiner* — Eric Ward (74) *Attorney, Agent, or Firm* — White & Case LLP (57) ABSTRACT

According to one embodiment, the second insulating film is provided between the first interconnect portion and the second interconnect portion, and at an outer periphery of a side face of the semiconductor layer. The optical layer is provided on the first side, and on the second insulating film at the outer periphery. The optical layer is transmissive with respect to light emitted from the light emitting layer. The film is provided between the second insulating film at the outer periphery and the optical layer. The film has a roughened surface on a side in contact with the optical layer.

20 Claims, 9 Drawing Sheets

(56) References Cited

U.S. PATENT DOCUMENTS

| | | | | |
|---|---|---|---|---|
| 2011/0220934 A1* | 9/2011 | Gotoda | ............... | H01L 33/0079 257/98 |
| 2011/0233585 A1* | 9/2011 | Kojima | ................ | H01L 33/486 257/98 |
| 2011/0266560 A1* | 11/2011 | Yao | .................... | H01L 33/0079 257/88 |
| 2011/0297997 A1* | 12/2011 | Izuka | ....................... | H01L 33/38 257/99 |
| 2011/0303938 A1 | 12/2011 | Uemura et al. | | |
| 2012/0068215 A1* | 3/2012 | Lee | ........................ | H01L 33/22 257/98 |
| 2012/0138984 A1* | 6/2012 | Kamiya | .................. | H01L 33/46 257/98 |
| 2012/0138988 A1* | 6/2012 | Lee | ........................ | H01L 33/62 257/98 |
| 2013/0015483 A1* | 1/2013 | Shimokawa | ............ | H01L 33/46 257/98 |
| 2013/0313589 A1 | 11/2013 | Tomizawa et al. | | |
| 2013/0313590 A1 | 11/2013 | Akimoto et al. | | |
| 2014/0061702 A1* | 3/2014 | Yamamoto | ............ | H01L 33/405 257/98 |
| 2015/0364664 A1 | 12/2015 | Akimoto et al. | | |

FOREIGN PATENT DOCUMENTS

| | | |
|---|---|---|
| TW | 201349572 A | 12/2013 |
| TW | 201351719 A | 12/2013 |

\* cited by examiner

SEMICONDUCTOR LIGHT EMITTING DEVICE WITH A FILM HAVING A ROUGHENED SURFACE

CROSS-REFERENCE TO RELATED APPLICATION

This application is based upon and claims the benefit of priority from Japanese Patent Application No. 2014-065820, filed on Mar. 27, 2014; the entire contents of which are incorporated herein by reference.

FIELD

Embodiments described herein relate generally to a semiconductor light emitting device.

BACKGROUND

A semiconductor light emitting device of a chip-sized package structure is proposed. In the semiconductor light emitting device, a fluorescent material layer is provided on a first side of a semiconductor layer including a light emitting layer. An electrode, an interconnect layer, and a resin layer are provided on a second side of the semiconductor layer. High reliability in practical use is desired for the semiconductor light emitting device of a chip-sized package structure.

BRIEF DESCRIPTION OF THE DRAWINGS

FIG. 3A to FIG. 9B are schematic cross-sectional views showing a method for manufacturing the semiconductor light emitting device of the embodiment.

DETAILED DESCRIPTION

According to one embodiment, a semiconductor light emitting device includes a semiconductor layer, a first electrode, a second electrode, a first insulating film, a first interconnect portion, a second interconnect portion, a second insulating film, an optical layer, and a film. The semiconductor layer includes a first side, a second side opposite to the first side, and a light emitting layer. The first electrode is provided on the semiconductor layer on the second side. The second electrode is provided on the semiconductor layer on the second side. The first insulating film is provided on the second side. The first interconnect portion is provided on the first insulating film and connected to the first electrode. The second interconnect portion is provided on the first insulating film and connected to the second electrode. The second insulating film is provided between the first interconnect portion and the second interconnect portion, and at an outer periphery of a side face of the semiconductor layer. The optical layer is provided on the first side, and on the second insulating film at the outer periphery. The optical layer is transmissive with respect to light emitted from the light emitting layer. The film is provided between the second insulating film at the outer periphery and the optical layer. The film has a roughened surface on a side in contact with the optical layer.

Embodiments will be described below with reference to drawings. Note that the same reference numerals are applied for the same elements in each drawing.

Figure 1:
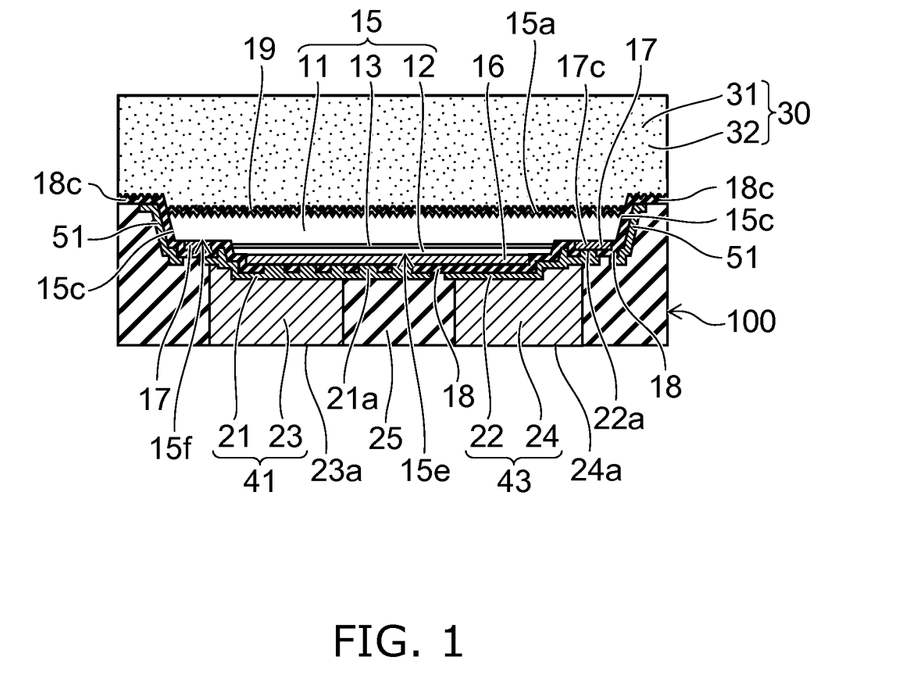
FIG. 1 is a schematic cross-sectional view of a semiconductor light emitting device of an embodiment.

FIG. 1 is a schematic cross-sectional view of a semiconductor light emitting device of an embodiment.

Figure 2A:
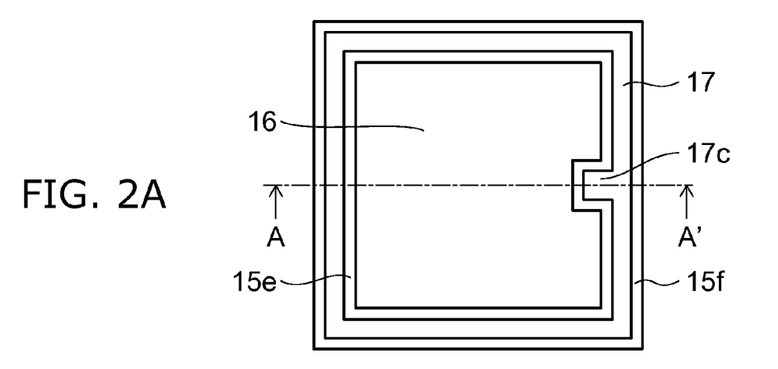
FIG. 2A to FIG. 2C are schematic plan views of the semiconductor light emitting device of the embodiment.

FIG. 2A is a schematic plan view illustrating an example of a planar layout for a p-side electrode 16 and an n-side electrode 17 of the semiconductor light emitting device of the embodiment. FIG. 1 corresponds to a cross-section taken along line A-A' in FIG. 2A. FIG. 2A corresponds to the drawing when viewing the second side of a semiconductor layer 15 after the removal of interconnect portions 41, 43, a resin layer 25, an insulating film 18, and a reflecting film 51 in FIG. 1. FIG. 2A also corresponds to a top view of a stacked body of FIG. 4B (without a substrate 10).

Figure 2B:
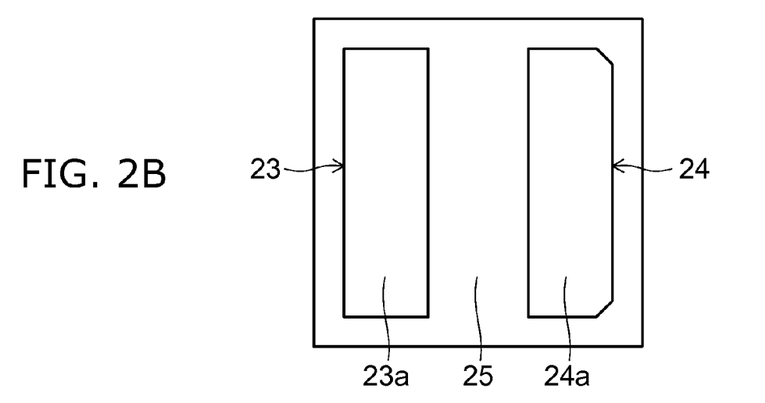

FIG. 2B is a schematic plan view of a mounting face (a lower face of the semiconductor light emitting device in FIG. 1) of the semiconductor light emitting device of the embodiment.

The semiconductor light emitting device of the embodiment is provided with a semiconductor layer 15 including a light emitting layer 13. The semiconductor layer 15 includes a first side 15a and a second side 15b on the side opposite the first side 15a (see FIG. 3A).

Figure 4A:
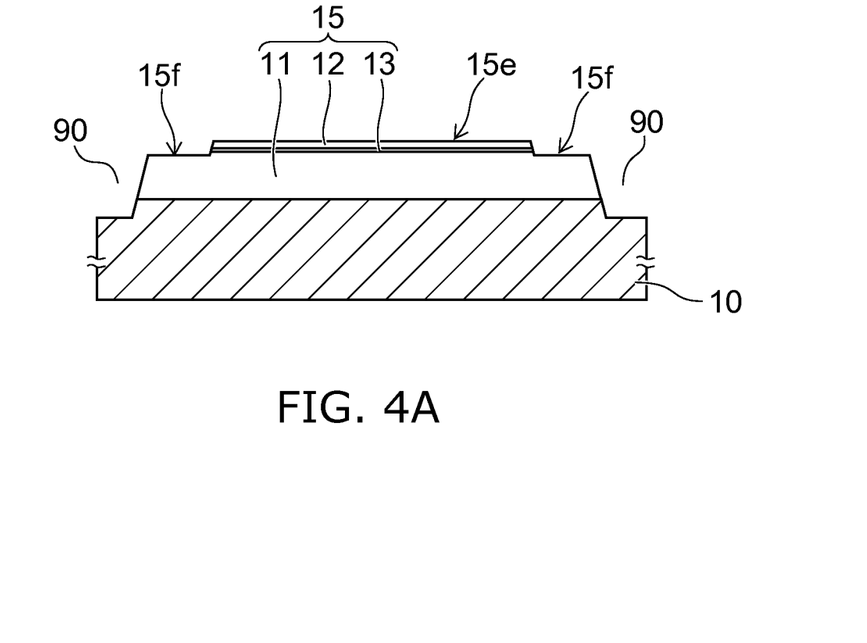

As illustrated in FIG. 4A, the second side 15b of the semiconductor layer 15 includes a portion (light emitting region) 15e including the light emitting layer 13 and a portion (non-light emitting region) 15f not including the light emitting layer 13. The portion 15e including the light emitting layer 13 is a portion on which the light emitting layer 13 of the semiconductor layer 15 is laminated. The portion 15f not including the light emitting layer 13 is a portion on which the light emitting layer 13 of the semiconductor layer 15 is not laminated. The portion 15e including the light emitting layer 13 represents a region with a laminated structure capable of extracting luminescent light from the light emitting layer 13 to the outside.

A p-side electrode 16 is provided on the second side on the portion 15e including the light emitting layer 13 as a first electrode, and an n-side electrode 17 is provided on the portion 15f not including the light emitting layer as a second electrode.

In the example illustrated in FIG. 2A, the portion 15f not including the light emitting layer 13 surrounds the portion 15e including the light emitting layer 13 and the n-side electrode 17 surrounds the p-side electrode 16.

Current is supplied to the light emitting layer 13 through the p-side electrode 16 and the n-side electrode 17, and the light emitting layer 13 emits light. The light emitted from the light emitting layer 13 exits outside the semiconductor light emitting device from the first side 15a.

As illustrated in FIG. 1, a support 100 is provided on the second side of the semiconductor layer 15. The support 100, provided on the second side, supports a light emitting element including the semiconductor layer 15, the p-side electrode 16, and the n-side electrode 17.

A fluorescent material layer 30 is provided on the first side 15a of the semiconductor layer 15 as an optical layer imparting the desired optical properties to the light emitted from the semiconductor light emitting device. The fluorescent material layer 30 contains a plurality of particulate fluorescent materials 31. The fluorescent materials 31 are excited by light emitted from the light emitting layer 13, and emit light with a different wavelength from the light emitted from the light emitting layer.

The plurality of fluorescent materials 31 is unified with a binder 32. The binder 32 is permeable with respect to light emitted from the light emitting layer 13 and light emitted from the fluorescent materials 31. Here, "permeable" is not limited to a transmittance of 100% and may include cases where a portion of the light is absorbed.

The semiconductor layer 15 includes a first semiconductor layer 11, a second semiconductor layer 12, and the light emitting layer 13. The light emitting layer 13 is provided between the first semiconductor layer 11 and the second semiconductor layer 12. The first semiconductor layer 11 and the second semiconductor layer 12 contain, for example, gallium nitride.

The first semiconductor layer 11 includes, for example, a foundation buffer layer, and an n-type GaN layer. The second semiconductor layer 12 includes, for example, a p-type GaN layer. The light emitting layer 13 contains materials that emit blue, purple, indigo, ultraviolet light, and the like. The peak wavelength of light emitted from the light emitting layer 13 is, for example, from 430 nm to 470 nm.

The second side of the semiconductor layer 15 is processed into an uneven shape. The protrusions are the portion 15e including the light emitting layer 13, while the recesses are the portion 15f not including the light emitting layer 13. The surface of the portion 15e including the light emitting layer 13 is the surface of the second semiconductor layer 12; the p-side electrode 16 is provided on the surface of the second semiconductor layer 12. The surface of the portion 15f not including the light emitting layer 13 is the surface of the first semiconductor layer 11; the n-side electrode 17 is provided on the surface of the first semiconductor layer 11.

The area of the portion 15e including the light emitting layer 13 on the second side of the semiconductor layer 15 is larger than the area of the portion 15f not including the light emitting layer 13. The area of the p-side electrode 16 provided on the surface of the portion 15e including the light emitting layer 13 is larger than the area of the n-side electrode 17 provided on the surface of the portion 15f not including the light emitting layer 13. Hereby, a large light emitting surface may be obtained, thus increasing the light output.

As illustrated in FIG. 2A, the n-side electrode 17 includes, for example, four linear portions, where a contact 17c is provided on one of the linear portions protruding in the width direction thereof. A via 22a in an n-side interconnect layer 22 is connected to the surface of the contact 17c as illustrated in FIG. 1.

As illustrated in FIG. 1, the second side of the semiconductor layer 15, the p-side electrode 16, and the n-side electrode 17 are covered with an insulating film 18 (first insulating film). The insulating film 18 is, for example, an inorganic insulating film such as a silicon oxide film. The insulating film 18 is also provided on the side face of the light emitting layer 13 and the side face of the second semiconductor layer 12, and covers the side faces.

The insulating film 18 is also provided on the side face 15c (the side face of the first semiconductor layer 11) extending from the first side 15a of the semiconductor layer 15, and covers the side face 15c.

Moreover, a portion of the insulating film 18 is provided on the outer periphery of the chip surrounding the side face 15c of the semiconductor layer 15 as an adhesive film 18c. On the first side 15a, the adhesive film 18c provided on the outer periphery of the chip extends in a direction away from the side face 15c. The insulating film 18 and the adhesive film 18c are integrally provided with the same material.

A p-side interconnect layer 21 as the first interconnect layer, and an n-side interconnect layer 22 as the second interconnect layer are provided on the insulating film 18 on the second side so as to be separated from each other. As illustrated in FIG. 5B, a plurality of first openings 18a leading to the p-side electrode 16, and second openings 18 leading to the contact 17c of the n-side electrode 17 are formed in the insulating film 18. The first openings 18a may be a larger single opening.

The p-side interconnect layer 21 is provided on the insulating film 18 and inside the first openings 18a. The p-side interconnect layer 21 is electrically connected to the p-side electrode 16 through vias 21a provided in the first openings 18a.

The n-side interconnect layer 22 is provided on the insulating film 18 and inside the second openings 18b. The n-side interconnect layer 22 is electrically connected to the contact 17c of the n-side electrode 17 through the vias 22a provided inside the second opening 18b.

The p-side interconnect layer 21 and the n-side interconnect layer 22 account for a majority of the second-side region and spreads out over the insulating film 18. The p-side interconnect layer 21 is connected to the p-side electrode 16 through the plurality of vias 21a.

Additionally, the reflecting film 51 covers the side face 15c of the semiconductor layer 15 with the insulating film 18 interposed therebetween. The reflecting film 51 is neither in contact with the side face 15c, nor electrically connected to the semiconductor layer 15. The reflecting film 51 is separated from the p-side interconnect layer 21 and the n-side interconnect layer 22. The reflecting film 51 is reflective with respect to light emitted from the light emitting layer 13 and light emitted from the fluorescent materials 31.

Figure 6A:
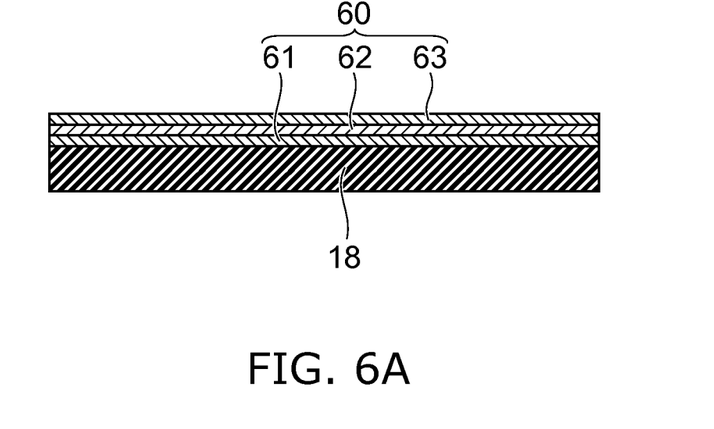

As illustrated in FIG. 6A, the reflecting film 51, the p-side interconnect layer 21, and the n-side interconnect layer 22 include a copper film that is, for example, simultaneously formed via plating onto a shared metal film 60.

The copper film constituting the reflecting film 51, the p-side interconnect layer 21, and the n-side interconnect layer 22 may be formed on a metal film 60 deposited via plating onto the insulating film 18. The thicknesses of the reflecting film 51, the p-side interconnect layer 21, and the n-side interconnect layer 22 are thicker than the thickness of the metal film 60, respectively.

The metal film 60 includes a metal foundation film 61, an adhesion layer 62, and a seed layer 63 consecutively laminated in that order from the insulating film 18 side.

The metal foundation film 61 is, for example, an aluminum film, which is highly reflective with respect to light emitted from the light emitting layer 13.

The seed layer 63 is a copper film used for extracting copper during plating. The adhesion layer 62 is, for example, a titanium film, which possesses excellent wettability with respect to both aluminum and copper.

The reflecting film 51 may be formed on the metal film 60 at the outer periphery of the chip, adjacent to the side face 15c of the semiconductor layer 15, without depositing a film (copper film) on the metal film 60. Inclusion of at least an aluminum film 61, ensures that the reflecting film 51 is highly reflective with respect to light emitted from the light emitting layer 13 and light emitted from the fluorescent materials 31.

Additionally, the metal foundation film (aluminum film) 61 remains beneath the p-side interconnect layer 21 and n-side interconnect layer 22, and therefore the aluminum film 61 is formed spreading out over a large region on the second side. Hereby, it is possible to significantly increase the amount of light oriented toward the fluorescent material layer 30 side.

A p-side metal pillar 23 is provided on the p-side interconnect layer 21 as a first metal pillar on a surface opposite the semiconductor layer 15. The p-side interconnect layer 21 and the p-side metal pillar 23 form a p-side interconnect portion (a first interconnect portion) 41.

An n-side metal pillar 24 is provided on the n-side interconnect layer 22 as a second metal pillar on a surface opposite the semiconductor layer 15. The n-side interconnect layer 22 and the n-side metal pillar 24 form an n-side interconnect portion (a second interconnect portion) 43.

A resin layer 25 is provided between the p-side interconnect portion 41 and the n-side interconnect portion 43 as a second insulating film. The resin layer 25 is provided between the p-side metal pillar 23 and the n-side metal pillar 24 so as to be in contact with the side face of the p-side metal pillar 23 and the side face of the n-side metal pillar 24. That is, the resin layer 25 fills between the p-side metal pillar 23 and the n-side metal pillar 24.

The resin layer 25 is also provided between the p-side interconnect layer 21 and the n-side interconnect layer 22, between the p-side interconnect layer 21 and the reflecting film 51, and between the n-side interconnect layer 22 and the reflecting film 51.

The resin layer 25 is provided on the periphery of the p-side metal pillar 23 and the periphery of the n-side metal pillar 24 and covers the side face of the p-side metal pillar 23 and the side face of the n-side metal pillar 24.

The resin layer 25 is also provided on the outer periphery of the chip adjacent to the side face 15c of the semiconductor layer 15 and covers the reflecting film 51.

The end portion (surface) of the p-side metal pillar 23 opposite the p-side interconnect layer 21 is exposed through the resin layer 25 to function as a p-side external terminal 23a connectable to an external circuit such as a mounting substrate and the like. The end portion (surface) of the n-side metal pillar 24 opposite the n-side interconnect layer 22 is exposed through the resin layer 25 to function as an n-side external terminal 24a connectable to an external circuit such as a mounting substrate and the like. The p-side external terminal 23a and the n-side external terminal 24a may be joined to land patterns on the mounting substrate through, for instance, solder or a conductive jointing material.

As illustrated in FIG. 2B, the p-side external terminal 23a and the n-side external terminal 24a are formed aligned in the same plane of the resin layer 25 so as to be separated from each other. The p-side external terminal 23a may be formed into rectangular, and the n-side external terminal 24a may be formed as a rectangle with two notched corners of the same size as the rectangle of the p-side external terminal 23a. Thereby, it is possible to distinguish the polarity of the external terminals. Naturally, the n-side external terminal 24a may be made into rectangular while the p-side external terminal 23a may be shaped a rectangle with two notched corners.

The gap between the p-side external terminal 23a and the n-side external terminal 24a is wider than the gap between the p-side interconnect layer 21 and the n-side interconnect layer 22 on the insulating film 18. The gap between the p-side external terminal 23a and the n-side external terminal 24a is larger than the solder spread during mounting. Thereby, it is possible to prevent a short-circuit between the p-side external terminal 23a and the n-side external terminal 24a through the solder.

In contrast, it is possible to reduce the gap between the p-side interconnect layer 21 and the n-side interconnect layer 22 to as much as allowable by limits on processing. Consequently, it is possible to increase the area of the p-side interconnect layer 21, and the contact area between the p-side interconnect layer 21 and the p-side metal pillar 23. It is thus possible to expedite the diffusion of heat from the light emitting layer 13.

The area of the p-side interconnect layer 21 in contact with the p-side electrode 16 through the plurality of vias 21a is larger than the area of the n-side interconnect layer 22 in contact with the n-side electrode 17 through the via 22a. Therefore, it is possible to equalize the current distribution flowing through the light emitting layer 13.

The area of the n-side interconnect layer 22 spreading out over the insulating film 18 may be made larger than the area of the n-side electrode 17. Additionally, the area of the n-side metal pillar 24 (the area of the n-side external terminal 24a) provided on the n-side interconnect layer 22 may be made larger than the n-side electrode 17. Thereby, it is possible to secure the area of an n-side external terminal 24a sufficient for highly reliable mounting while reducing the area of the n-side electrode 17. That is, it is possible to reduce the area of the portion 15f (the non-light emitting region) not including the light emitting layer 13 of the semiconductor layer 15 and increase the area of the portion 15e (the light emitting region) including the light emitting layer 13 to improve light output.

The first semiconductor layer 11 is electrically connected to the n-side metal pillar 24 via the n-side electrode 17 and the n-side interconnect layer 22. The second semiconductor layer 12 is electrically connected to the p-side metal pillar 23 via the p-side electrode 16 and the p-side interconnect layer 21.

The thickness of the p-side metal pillar 23 (the thickness in the direction connecting the p-side interconnect layer 21 and the p-side external terminal 23a) is thicker than the thickness of the p-side interconnect layer 21. The thickness of the n-side metal pillar 24 (thickness in the direction connecting the n-side interconnect layer 22 and the n-side external terminal 24a) is thicker than the thickness of the n-side interconnect layer 22. The thicknesses of the p-side metal pillar 23, the n-side metal pillar 24, and the resin layer 25 are thicker than the thickness of the semiconductor layer 15, respectively.

The aspect ratio (ratio of the planar size to the thickness) of the metal pillars 23, 24 may be 1 or greater, or less than 1. That is, the metal pillars 23, 24 may be thicker, or thinner than the planar sizes thereof.

The thickness of the support 100 including the p-side interconnect layer 21, the n-side interconnect layer 22, the p-side metal pillar 23, the n-side metal pillar 24, and the resin layer 25 may be thicker than the thickness of the light emitting element (LED chip) including the semiconductor layer 15, the p-side electrode 16, and the n-side electrode 17.

The semiconductor layer 15 is formed on the substrate using an epitaxial growth method, as described below. The substrate is removed after the support 100 is formed thereon, and the semiconductor layer 15 does not include the substrate on the first side 15a. The semiconductor layer 15 is not supported by the rigid sheet-like substrate, but is rather supported by the support 100 comprised of a composite of the metal pillars 23, 24 and the resin layer 25.

For instance, copper, gold, nickel, silver, and the like may be used as the material in the p-side interconnect portion 41 and the n-side interconnect portion 43. Among these, copper provides favorable thermal conductivity, increased migration resistance, and improved adhesion with respect to the insulating material.

The resin layer 25 reinforces the p-side metal pillar 23 and the n-side metal pillar 24. It is desirable to use a resin layer 25 that has nearly the same or the same coefficient of thermal expansion as the mounting substrate. Examples of such a resin layer 25 include a resin containing primarily epoxy resin, a resin containing primarily silicone resin, or a resin containing primarily fluororesin.

Additionally, the resin used as the base for the resin layer 25 contains light shielding material (a light absorbing agent, a light reflecting agent, a light scattering agent, or the like); furthermore, the resin layer 25 possesses light shielding properties with respect to the luminescent light from the light emitting layer 13. Hereby, it is possible to prevent light from leaking from the side face of the support 100 and from the mounting face side.

Due to the thermal cycle while mounting the semiconductor light emitting device, a stress caused by the solder joining the p-side external terminal 23a and the n-side external terminal 24a to the lands on the mounting substrate is applied to the semiconductor layer 15. The p-side metal pillar 23, the n-side metal pillar 24, and the resin layer 25 absorb and relax that stress. Using the resin layer 25 in particular, which is more flexible than the semiconductor layer 15, as a portion of the support 100 may increase the stress relaxation effects.

The reflecting film 51 is separated from the p-side interconnect portion 41 and the n-side interconnect portion 43. Therefore, the stress applied to the p-side metal pillar 23 and the n-side metal pillar 24 during mounting is not transmitted to the reflecting film 51. Accordingly, it is possible to suppress peeling of the reflecting film 51. This also prevents stress from being applied to the side face 15c side of the semiconductor layer 15.

As is later described, the substrate used in forming the semiconductor layer 15 is removed from the semiconductor layer 15. Hereby, the semiconductor light emitting device is given a low profile. It is also possible to form minute recesses and protrusions on the first side 15a of the semiconductor layer 15, improving the light-extraction efficiency thereof.

For example, the first side 15a may be wet etched using an alkaline solution to form the minute recesses and protrusions thereon. Thereby, the total reflection component at the first side 15a decreases and the light-extraction efficiency thereof can be improved.

After removing the substrate, the fluorescent material layer 30 is formed via an insulating film 19 on the first side 15a. The insulating film 19 functions as an adhesion layer for increasing the adhesion between the semiconductor layer 15 and the fluorescent material layer 30; for instance, the insulating film 19 may be a silicon oxide film or a silicon nitride film.

The fluorescent material layer 30 has a structure in which a plurality of particulate fluorescent materials 31 is dispersed throughout a binder 32. For instance, a silicone resin may be used as the binder 32.

The fluorescent material layer 30 is also formed on the outer periphery of the chip surrounding the side face 15c of the semiconductor layer 15. Accordingly, the fluorescent material layer 30 has a larger planar size than the semiconductor layer 15. The fluorescent material layer 30 is provided on the adhesive film 18c in the outer periphery of the chip.

The fluorescent material layer 30 is limited to the first side 15a of the semiconductor layer 15 and the region adjacent to the side face 15c of the semiconductor layer 15; the fluorescent material layer 30 is not formed on the second side of the semiconductor layer 15, at the periphery of the metal pillars 23, 24, or the side faces of the support 100. The side face of the fluorescent material layer 30 and the side face of the support 100 (the side face of the resin layer 25) are flush.

Namely, the semiconductor light emitting device of the embodiment is an extremely small semiconductor light emitting device with a chip-sized package structure. Therefore, this increases the flexibility of lighting design when adopting the semiconductor light emitting device in a lamp, for example.

Additionally, because the fluorescent material layer 30 is not provided in excess on the mounting face side from which light is not extracted to the outside, the cost can be reduced. Furthermore, even if there is no substrate on the first side 15a, it is possible to dissipate heat from the light emitting layer 13 toward the mounting substrate side via the p-side interconnect layer 21 and the n-side interconnect layer 22 which are spread out over the second side; thus, the device may be small while having excellent heat dissipation properties.

In a typical flip-chip mounting, a fluorescent material layer is formed so as to cover the entire chip after mounting the LED chip on the mounting substrate via bumps and the like. Alternatively, a resin is used for under filling between the bumps.

In contrast, according to the embodiment, a resin layer 25 different from the fluorescent material layer 30 is provided at the periphery of the p-side metal pillar 23 and the periphery of the n-side metal pillar 24 before mounting, in order to imbue the mounting face side with properties suited for stress relaxation. Additionally, because the resin layer 25 is already provided on the mounting face side, there is no need for under filling after mounting.

The first side 15a is provided with a layer designed with excellent light-extraction efficiency, color conversion efficiency, distribution of luminous intensity and the like, while the mounting face side is provided with a layer designed with excellent stress relaxation properties during mounting, and with properties allowing the layer to act as a support in place of a substrate. For example, the resin layer 25 is constituted of a base resin densely filled with a filler of silica particles and the like, and is adjusted to a hardness suitable for a support.

The light emitted from the light emitting layer 13 to the first side 15a incidents on the fluorescent material layer 30; a portion of that light excites the fluorescent materials 31 and light from the light emitting layer 30 and from the fluorescent materials 31 are combined into, for example, white light.

If a substrate is provided on the first side 15a, then light emitted from the light emitting layer 13 does not incident on the fluorescent material layer 30, thus creating light that leaks outside from the side face of the substrate. In other words, light from the light emitting layer 13 with a strong tinge leaks from the side face of the substrate, this leads to color breakup or uneven color such as a ring of blue light at the periphery when the fluorescent material layer 30 is viewed from above.

Whereas, according to this embodiment, given that there is no substrate between the first side 15a and the fluorescent material layer 30, it is possible to prevent color breakup and uneven color due to the leakage of light with a strong tinge from the light emitting layer 13 from the substrate side face.

Moreover, according to the embodiment, the reflecting film 51 is provided on the side face 15c of the semiconductor layer 15 via the insulating film 18. Light heading toward the side face 15c of the semiconductor layer 15 from the light emitting layer 13 is reflected by the reflecting film 51 and does not leak outside. Therefore, coupled with the absence of a substrate on the first side 15*a*, it is possible to prevent color breakup and uneven color due to the light leakage from the side face side of the semiconductor light emitting device.

The insulating film 18 provided between the reflecting film 51 and the side face 15*c* of the semiconductor layer 15 prevents metal contained in the reflecting film 51 from diffusing into the semiconductor layer 15. Thereby, it is possible to prevent metal pollution of, for example, the GaN in the semiconductor layer 15, and prevent deterioration of the semiconductor layer 15.

Furthermore, the adhesive film 18*c* provided between the reflecting film 51 and the fluorescent material layer 30, and between the resin layer 25 and the fluorescent material layer 30 increases the adhesion between the reflecting film 51 and the fluorescent material layer 30, and the adhesion between the resin layer 25 and the fluorescent material layer 30.

The insulating film 18 and the adhesive film 18*c* are, for example, an inorganic insulating film such as a silicon oxide film, a silicon nitride film, or the like. That is, the first side 15*a* and the second side of the semiconductor layer 15, the side face 15*c* of the first semiconductor layer 11, the side face of the second semiconductor layer 12, and the side face of the light emitting layer 13 are covered with an inorganic insulating film. The inorganic insulating film surrounds the semiconductor layer 15 to shield the semiconductor layer 15 from metal, moisture, and the like.

Each element described above of the semiconductor light emitting device of the embodiment is formed in a wafer state as described below, and is separated into an individual piece, as illustrated in FIG. 1. For example, it is separated into an individual piece by dicing using a blade. The side face of the semiconductor light emitting device illustrated in FIG. 1 corresponds to a cut surface cut in the wafer state by a blade. It is possible that due to the winding, such as grinding stone or the like, the fluorescent material layer 30 of the cutting surface peels off in dicing using the blade.

According to the embodiment, the surface of the adhesive film 18*c* for adhering the fluorescent material layer 30 on the outer periphery of the chip which is a region between the side face 15*c* of the semiconductor layer 15 and the cut surface (device side face) to the resin layer 25 and the reflecting film 51 is roughened. Thus, the adhesion of the fluorescent material layer 30 relative to the reflecting film 51 and the resin layer 25 is improved, and it is possible to prevent the peeling of the fluorescent material layer 30 during dicing.

The film thickness of the adhesive film 18*c* is, for example, from 600 nm to 900 nm. In the adhesive film 18*c*, recesses and protrusions of, for example, from several nm to several tens of nm are formed on the surface on the side in contact with the fluorescent material layer 30. That is, the plurality of protrusions of a height from several nm to several tens of nm, and the plurality of recesses of a depth from several nm to several tens of nm, are formed on the surface of the adhesive film 18*c*.

Figure 2C:
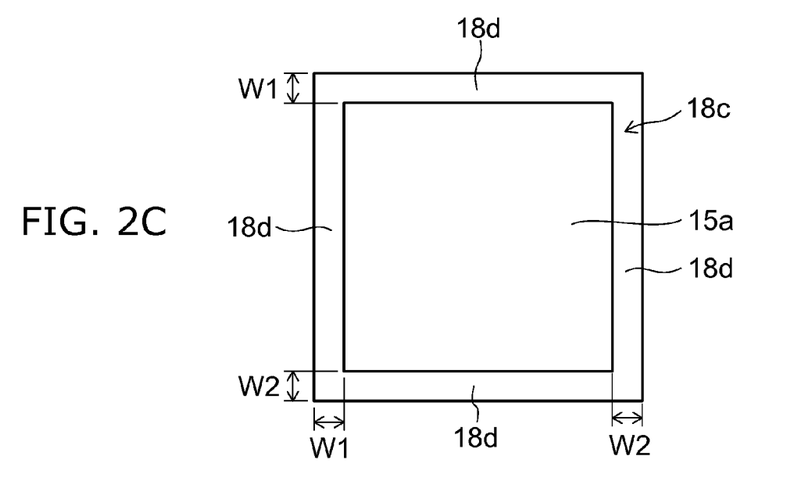

FIG. 2C is a schematic plan view of the first side 15*a* excluding the fluorescent material layer 30 and the insulating film 19 in the semiconductor light emitting device of the embodiment.

The planar shape of the first side 15*a* of the semiconductor layer 15 is formed as, for example, a rectangle. The adhesive film 18*c* is formed on the outer periphery of the chip so as to surround the rectangle of the first side 15*a*. Alternatively, the planar shape of the first side 15*a* of the semiconductor layer 15 is not limited to a rectangle and may be a polygon. The adhesive film 18*c* is provided along the outer periphery of the semiconductor layer 15 irrespective of the shape of the first side 15*a*. In the example illustrated in FIG. 2C, the adhesive film 18*c* is provided corresponding to the four sides of the planar shape of the rectangular shape of the first side 15*a* and has four linear regions 18*d* along each side of the four sides.

Roughed surface is formed on each of the four linear regions 18*d*. Also, a roughed surface is formed across all of the four linear regions 18*d*. That is, the entire region of the surface on the side in contact with the fluorescent material layer 30 in the adhesive layer 18*c* is roughened.

Therefore, the surface of the side in contact with the fluorescent material layer 30 in the adhesive layer 18*c* and the region (the region with lower adhesion than the roughened region) not roughened is not unevenly distributed and it is possible to prevent the peeling of the fluorescent material layer 30 due to stress concentration in that region.

Furthermore, the adhesive film 18*c* covers the end portion on the fluorescent material layer 30 side of the reflecting film 51 and the reflecting film 51 which is a metal film is not in contact with the fluorescent material layer 30. Adhesion between the fluorescent material layer 30 and adhesive film 18*c* which is an inorganic film is higher than the adhesion between the metal film and the fluorescent material layer 30.

In FIG. 2C, it is desirable that the widths of the adhesive film 18*c* on one side of the four sides (the widths of one linear region 18*d*) W1, W2 are not less than 5 μm in order to reliably cover the end portion of the reflecting film 51 with the adhesive film 18*c*.

Furthermore, the sum (W1+W2) of the widths of the pair of the linear region 18*d* provided corresponding to the two opposing sides of the four sides of the planar shape of the rectangle of the first side 15*a* is not less than 10 μm. Also, according to the embodiment, the region of width W1 of not less than 5 μm, the region of width W2 of not less than 5 μm, and the region of widths (W1+W2) of not less than 10 μm are roughened. This is of sufficient width to increase the adhesion with the fluorescent material layer 30.

Next, a method of manufacturing the semiconductor light emitting device is described with reference to FIGS. 3A to 9B.

Figure 3A:
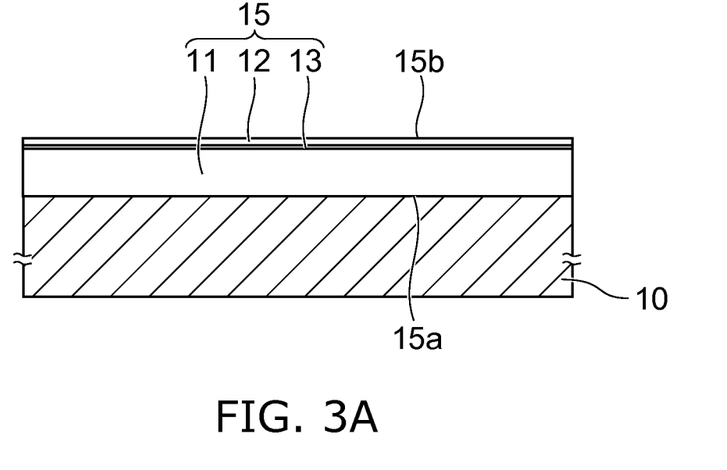

As illustrated in FIG. 3A, the first semiconductor layer 11, the light emitting layer 13, and the second semiconductor layer 12 are epitaxially grown in that order on the major surface side of the substrate 10, by, for example, a metal organic chemical vapor deposition (MOCVD).

In the semiconductor layer 15, the substrate 10 side is the first side 15*a* and the opposite side of the substrate 10 is the second side 15*b*.

The substrate 10 is, for example, a silicon substrate. Alternatively, the substrate 10 may be a sapphire substrate. The semiconductor layer 15 is a nitride semiconductor layer containing, for example, gallium nitride (GaN).

The first semiconductor layer 11 includes, for example, a buffer layer provided on the major surface side of the substrate 10, and an n-type GaN layer provided on the buffer layer. The second semiconductor layer 12 includes, for example, a p-type AlGaN layer provided on the light emitting layer 13, and a p-type GaN layer provided thereon. The light emitting layer 13 has, for example, a multiple quantum well (MQW) structure.

Figure 3B:
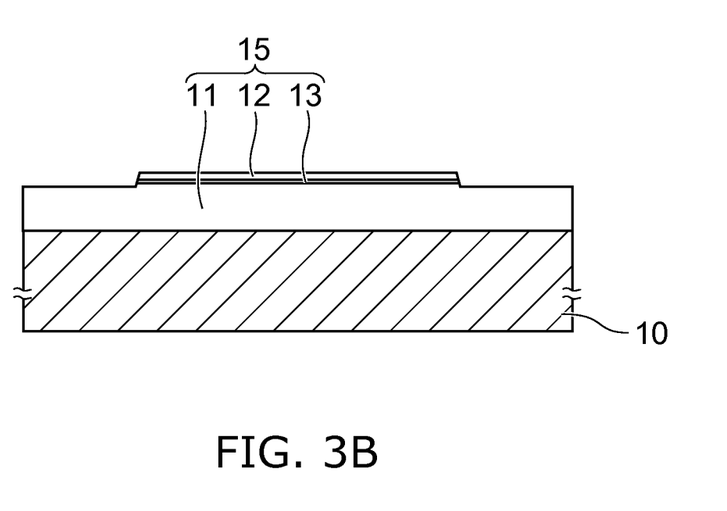

FIG. 3B illustrates the state in which the second semiconductor layer 12 and the light emitting layer 13 are selectively removed. For example, the second semiconductor layer 12 and the light emitting layer 13 are selectively etched using a reactive ion etching (RIE) to expose the first semiconductor layer 11.

Next, as illustrated in FIG. 4A, the first semiconductor layer 11 is selectively removed to form a grooves 90. The semiconductor layer 15 is divided into a plurality of segments on the major surface side of the substrate 10 by the grooves 90. The grooves 90 are formed as, for example, a lattice pattern on the substrate 10 side in the wafer state.

The grooves 90 pass through the semiconductor layer 15 and reach the substrate 10. At this time, by controlling etching parameters such as the etching time and the like, the major surface of the substrate 10 is superficially etched, so the bottom faces of the groove 90 retreat farther below than the interface between the substrate 10 and the semiconductor layer 15. The grooves 90 may be formed after forming the p-side electrode 16 and the n-side electrode 17.

Figure 4B:
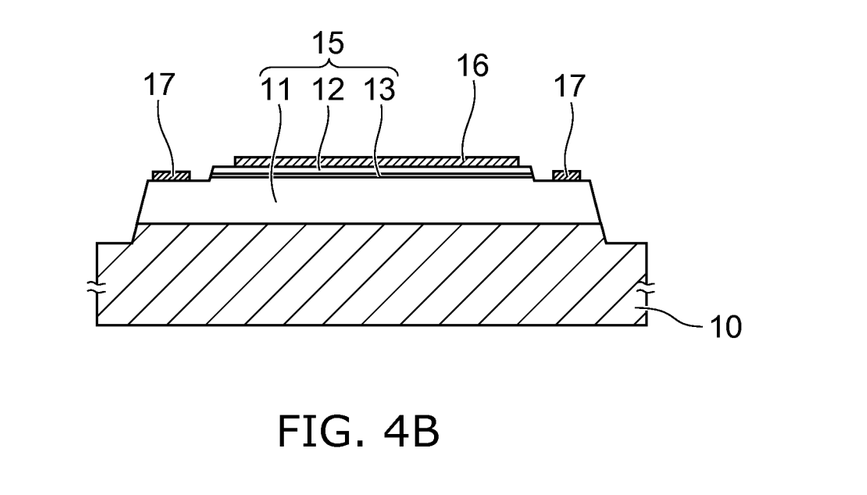

Next, as illustrated in FIG. 4B, the p-side electrode 16 is formed on the surface of the second semiconductor layer 12. The n-side electrode 17 is also formed on the surface of the first semiconductor layer 11 on the region in which the second semiconductor layer 12 and the light emitting layer 13 are selectively removed.

The p-side electrode 16, which is formed in the region whereon the light emitting layer is laminated, includes a reflecting film that reflects the light emitted from the light emitting layer 13. For example, the p-side electrode 16 contains silver, silver alloy, aluminum, aluminum alloy, and the like. To prevent the sulfuration or oxidation of the reflecting film, the p-side electrode 16 also includes a metal protective film (barrier metal).

Figure 5A:
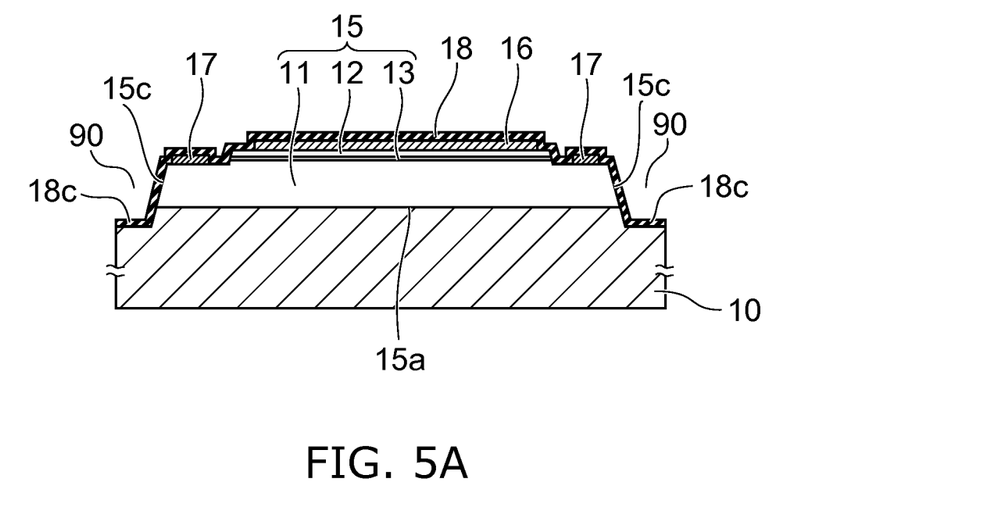
Figure 5B:
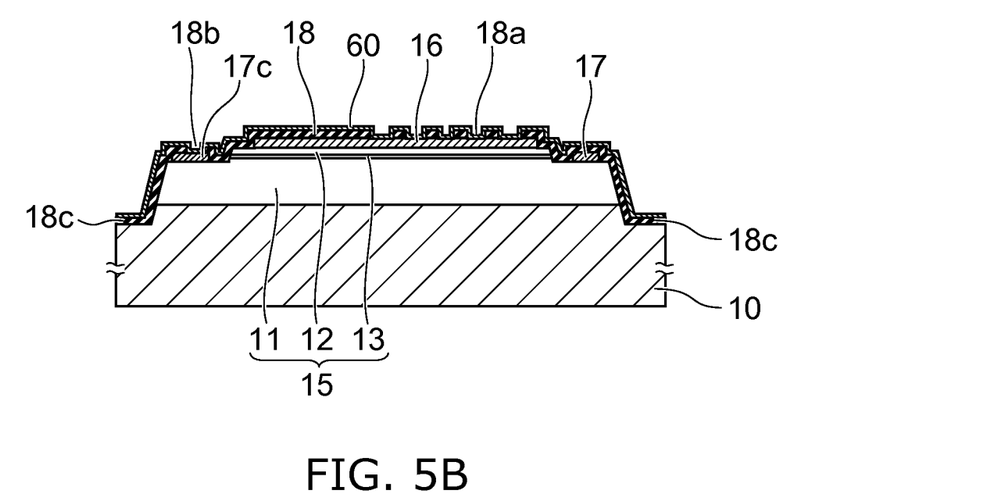

Next, as illustrated in FIG. 5A, the insulating film 18 is formed so as to cover the stacked body provided on the substrate 10. The insulating film 18 covers the second side of the semiconductor layer 15, the p-side electrode 16, and the n-side electrode 17. The insulating film 18 also covers the side face 15c which extends from the first side 15a of the semiconductor layer 15. The insulating film 18 is further formed on the surface of the substrate 10 of the bottom face of the grooves 90. A portion of the insulating film 18 formed on the surface of the substrate 10 of the bottom face of the grooves 90 is the adhesive film 18c described above.

The insulating film 18 is a silicon oxide film or a silicon nitride film formed using a chemical vapor deposition (CVD), for example. For instance, the first openings 18a and the second openings 18b are wet etched using a resist mask in the insulating film 18 as illustrated in FIG. 5B. The first openings 18a reach the p-side electrode 16 and the second openings 18b reach the contact 17c of the n-side electrode 17.

Next, as illustrated in FIG. 5B, the metal film 60 is formed on the surface of the insulating film 18, the inner walls (side walls and bottom faces) of the first openings 18a, and the inner walls (side walls and bottom faces) of the second openings 18b. The metal film 60 includes, for example, an aluminum film 61, a titanium film 62, and a copper film 63 as illustrated in FIG. 6A. The metal film 60 is formed, for example, using sputtering, and the like.

Figure 6B:
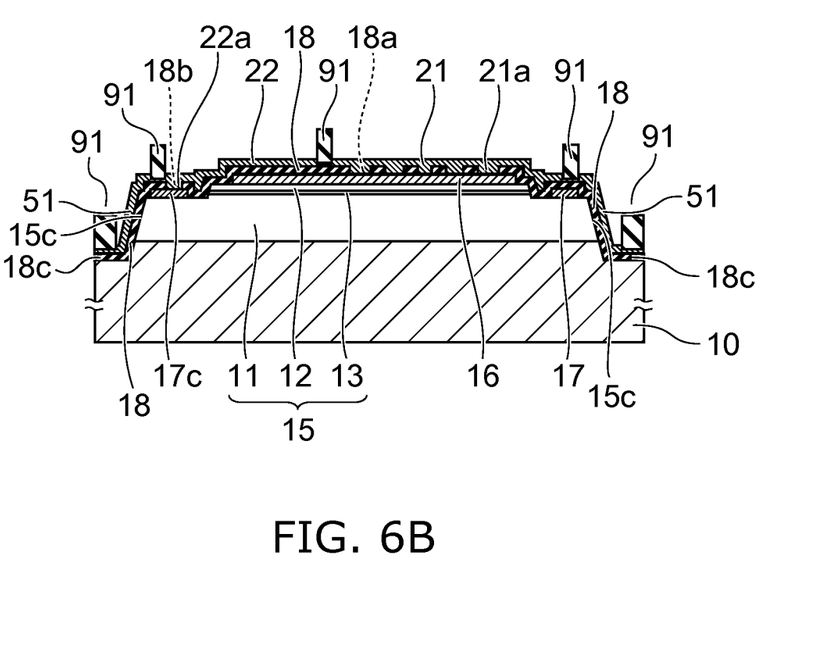

After selectively forming a resist mask 91 illustrated in FIG. 6B on the metal film 60, the p-side interconnect layer 21, the n-side interconnect layer 22, and the metal film 51 are formed by copper electroplating, with the copper film 63 in the metal film 60 as a seed layer.

The p-side interconnect layer 21 is also formed in the first openings 18a and is electrically connected to the p-side electrode 16. The n-side interconnect layer 22 is also formed in the second openings 18b and is electrically connected to the contact 17c of the n-side electrode 17.

Figure 7A:
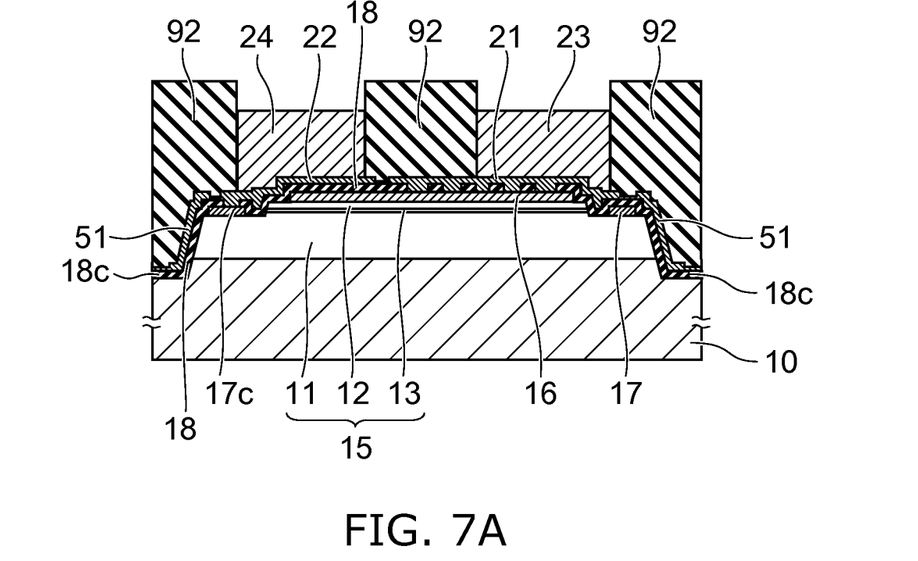

Next, the resist mask 91 is removed using, for example, a solvent or oxygen plasma; thereafter the resist mask 92 illustrated in FIG. 7A is selectively formed. Alternatively, the resist mask 92 may be formed without removing the resist mask 91.

After forming the resist mask 92, the p-side metal pillar 23 and the n-side metal pillar 24 are copper electroplated using the p-side interconnect layer 21 and the n-side interconnect layer 22 as a seed layer.

The p-side metal pillar 23 is formed on the p-side interconnect layer 21. The p-side interconnect layer 21 is integrated with the p-side metal pillar 23 with the same copper material. The n-side metal pillar 24 is formed on the n-side interconnect layer 22. The n-side interconnect layer 22 is integrated with the n-side metal pillar 24 with the same copper material.

The resist mask 92 is removed using, for example, a solvent or oxygen plasma. At this point, the p-side interconnect layer 21 and the n-side interconnect layer 22 are connected through the metal film 60. The p-side interconnect layer 21 and the reflecting film 51 are also connected through the metal film 60, and the n-side interconnect layer 22 and the reflecting film 51 are also connected through the metal film 60.

With that, the metal film 60 between the p-side interconnect layer 21 and the n-side interconnect layer 22, the metal film 60 between the p-side interconnect layer 21 and the reflecting film 51, and the metal film 60 between the n-side interconnect layer 22 and the reflecting film 51 are all removed by way of etching.

Figure 7B:
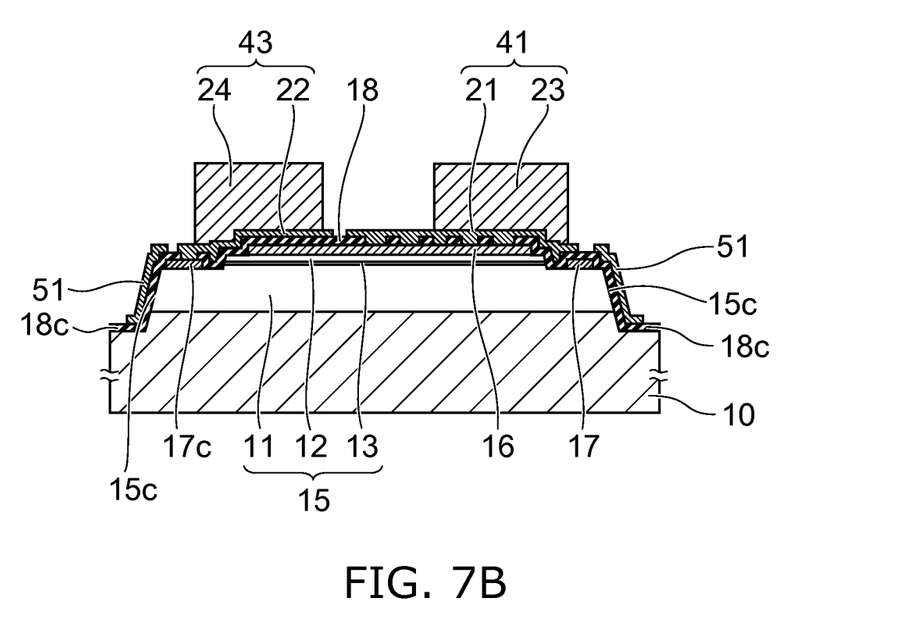

Hereby, the electrical connections via the metal film 60 between the p-side interconnect layer 21 and the n-side interconnect layer 22, between the p-side interconnect layer 21 and the reflecting film 51, and between the n-side interconnect layer 22 and the reflecting film 51 are all respectively separated (FIG. 7B).

Figure 8A:
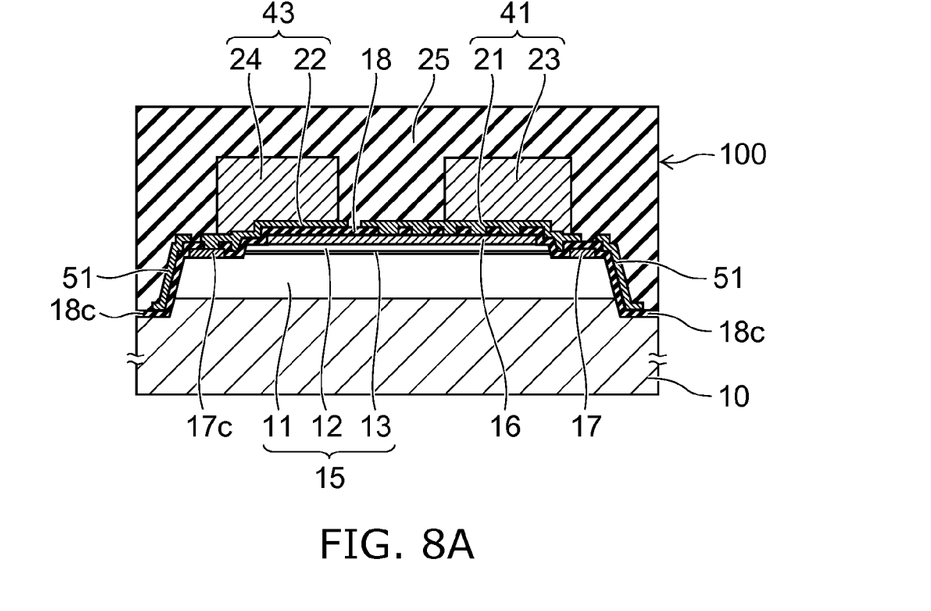

Next, the resin layer 25 illustrated in FIG. 8A is formed on the structure illustrated in FIG. 7B. The resin layer 25 covers the p-side interconnect portion 41 and the n-side interconnect portion 43. The resin layer 25 also covers the reflecting film 51.

The resin layer 25 constitutes the support 100 with the p-side interconnect portion 41 and the n-side interconnect portion 43. The substrate 10 is removed while the semiconductor layer 15 is supported by the support 100.

For example, the substrate 10 which is a silicon substrate is removed using a dry etching. Alternatively, the silicon substrate 10 may be removed by way of wet etching. Furthermore, if the substrate 10 is the sapphire substrate, the substrate 10 may be removed using a laser lift-off process.

There are cases where the semiconductor layer 15 epitaxially grown onto the substrate 10 may be subject to large internal stresses. Furthermore, the p-side metal pillar 23, the n-side metal pillar 24, and the resin layer 25 are a more flexible material compared to the semiconductor layer 15 of a GaN based material. Accordingly, even if the internal stresses created during epitaxial growth are released all at once when the substrate 10 is peeled off, the p-side metal pillar 23, the n-side metal pillar 24, and the resin layer 25 absorb the stress. Consequently, it is possible to avoid breaking the semiconductor layer 15 during the process of removing the substrate 10.

Figure 8B:
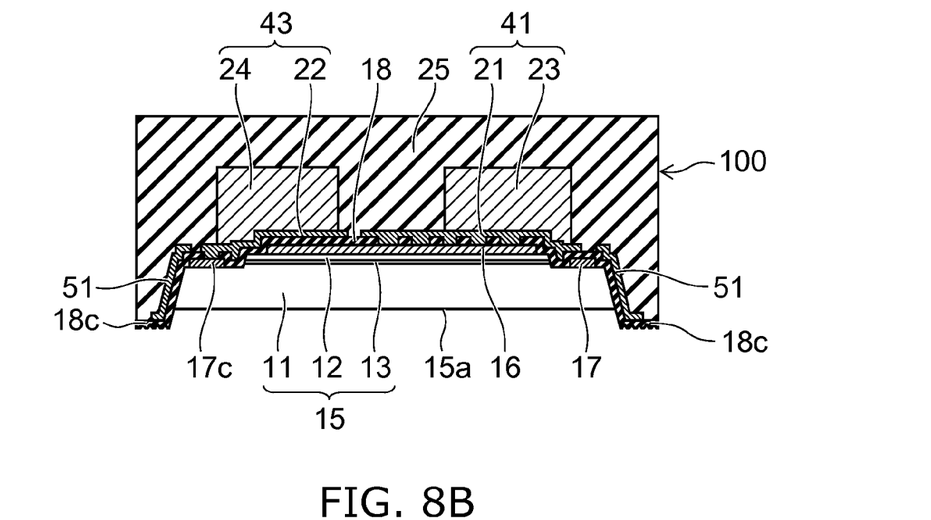

The substrate 10 is removed by, for example, a reactive ion etching (RIE). At this time, even after the substrate 10 is removed, the RIE is continued and the surface of the adhesion layer 18c exposed by the removal of the substrate 10 is roughened as illustrated in FIG. 8B.

Furthermore, removal of the substrate 10 exposes the first side 15a of the semiconductor layer 15. The minute recesses and protrusions are formed on the exposed first side 15a. For example, the first side 15a is wet etched with a potassium hydroxide (KOH) aqueous solution, tetramethyl ammonium hydroxide (TMAH), and the like. A difference in etching speed depending on the crystal plane orientation occurs during etching. Thus, it is possible to form recesses and protrusions on the first side 15a. Forming the minute recesses and protrusions on the first side 15a improves the light-extraction efficiency of the light emitted from the light emitting layer 13.

Figure 9A:
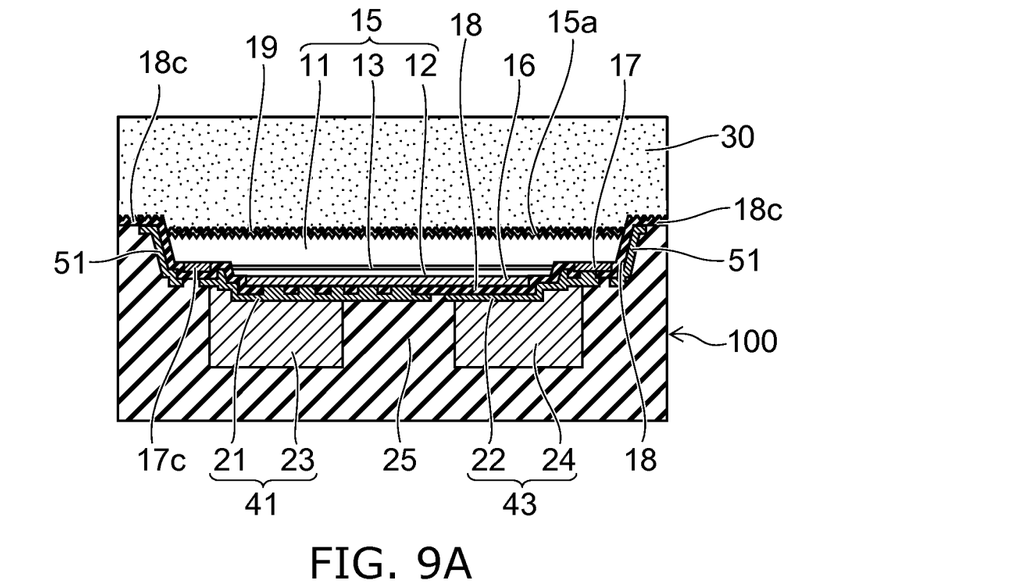

The fluorescent material layer 30 is formed on the first side 15a via the insulating film 19 as illustrated in FIG. 9A. The fluorescent material layer 30 is formed by a method such as printing, potting, molding, or compression molding. The insulating film 19 increases the adhesion between the semiconductor layer 15 and the fluorescent material layer 30.

Additionally, a sintered fluorescent material obtained by sintering a fluorescent material via a binder may be adhered to the fluorescent material layer 30 via the insulating film 19 as the fluorescent material layer 30.

The fluorescent material layer 30 is also formed on the region surrounding the side face 15c of the semiconductor layer 15. The resin layer 25 is also provided on the region surrounding the side face 15c of the semiconductor layer 15. The fluorescent material layer 30 is formed on the resin layer 25 via the adhesive film 18c. It is possible to improve the adhesive force with the fluorescent material layer 30 because the surface of the adhesive film 18c is roughened.

Figure 9B:
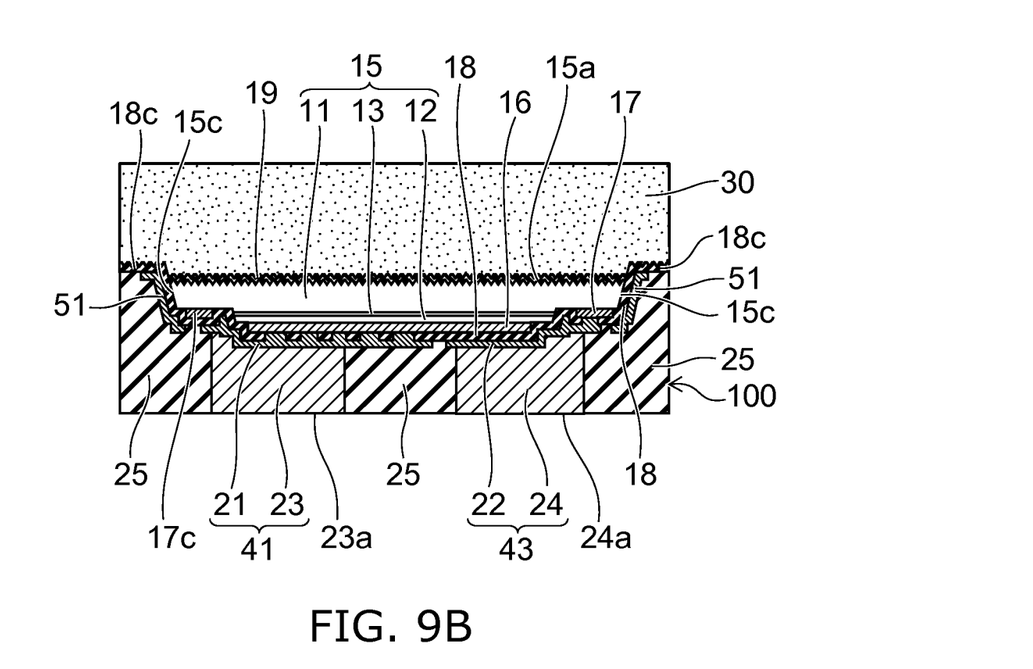

After the forming of the fluorescent material layer 30, the surface of the resin layer 25 (the lower surface in FIG. 9A) is ground and the p-side metal pillar 23 and the n-side metal pillar 24 are exposed through the resin layer 25, as illustrated in FIG. 9B. The exposed surface of the p-side metal pillar 23 is the p-side external terminal 23a, and the exposed surface of the n-side metal pillar 24 is the n-side external terminal 24a.

Subsequently, the structure illustrated in FIG. 9B is cut at the region in which the above-described grooves 90 divide the plurality of semiconductor layers 15 into a plurality of segments. Namely, the fluorescent material layer 30, the adhesive film 18c, and the resin layer 25 are cut. The semiconductor layer 15 is not present in the dicing region, so the semiconductor layer 15 is not damaged by dicing.

The previously described processes before the wafer is separated into individual pieces are carried out on a wafer including the multiple semiconductor layers 15. The wafer is separated into an individual piece as a semiconductor light emitting device including at least one semiconductor layer 15. The semiconductor light emitting device may be a single-chip structure including a single semiconductor 15, or may be a multi-chip structure including a plurality of semiconductor layers 15.

Because the previously described processes before the wafer is separated into individual pieces are carried out in a wafer form all at once, there is no need to form an interconnect layer, form the pillars, package using the resin layer, and form the fluorescent material layer on each individual piece of devices, and thus the cost of manufacture can be drastically reduced.

The support 100 and fluorescent material layer 30 are formed in the wafer form and then cut, and therefore the side faces of the fluorescent material layer 30 and the support 100 (resin layer 25) are flush and form the side face of a semiconductor light emitting device separated out into an individual piece. Accordingly, coupled with the absence of the substrate 10, it is possible to provide a small semiconductor light emitting device with a chip-sized package structure.

In the previously described embodiments, the optical layer provided to the first side 15a of the semiconductor layer 15 is not limited to a fluorescent material layer, and may be a scattering layer. The scattering layer may include a plurality of particulate scattering materials (a titanium compound, for example) for scattering the light emitted from the light emitting layer 13, and a binder (a resin layer, for example) that unifies the plurality of particulate scattering materials and is permeable to the light emitted from the light emitting layer 13.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device, comprising:
a semiconductor layer including a first side, a second side opposite to the first side, and a light emitting layer;
a first electrode provided on the semiconductor layer on the second side;
a second electrode provided on the semiconductor layer on the second side;
a first insulating film provided on the second side;
a first interconnect portion provided on the first insulating film and connected to the first electrode;
a second interconnect portion provided on the first insulating film and connected to the second electrode;
a second insulating film provided between the first interconnect portion and the second interconnect portion, and at an outer periphery of a side face of the semiconductor layer;
an optical layer provided on the first side, and on the second insulating film at the outer periphery, the optical layer being transmissive with respect to light emitted from the light emitting layer; and
a film provided between the second insulating film at the outer periphery and the optical layer, the film having a roughened surface on a side in contact with the optical layer at the outer periphery.

2. The device according to claim 1, wherein a planar shape of the first side of the semiconductor layer is formed as a rectangle, and the film includes four parts corresponding to four sides of the rectangle.

3. The device according to claim 1, wherein the film is provided along an outer periphery of the semiconductor layer.

4. The device according to claim 2, wherein a total value of widths of two parts of the film provided corresponding to two opposing sides of the four sides is not less than 10 µm.

5. The device according to claim 2, wherein a width of one part of the film provided corresponding to one side of the four sides is not less than 5 µm.

6. The device according to claim 1, wherein
the first interconnect portion includes a first interconnect layer provided on the first insulating film and a first metal pillar provided on the first interconnect layer, the first metal pillar being thicker than the first interconnect layer, and the second interconnect portion includes a second interconnect layer provided on the first insulating film and a second metal pillar provided on the second interconnect layer, the second metal pillar being thicker than the second interconnect layer.

7. The device according to claim 1, wherein the optical layer is a fluorescent material layer including:
- a plurality of fluorescent materials excited by the light emitted from the light emitting layer and emitting a light having a different wavelength from the light emitted from the light emitting layer and
- a binder binding the plurality of fluorescent materials and transmissive with respect to the light emitted from the light emitting layer and light emitted from the fluorescent materials.

8. The device according to claim 1, wherein the first insulating film is also provided on a side face extending from the first side of the semiconductor layer.

9. The device according to claim 8, wherein the film is provided integrally with same material as the first insulating layer.

10. The device according to claim 8, further comprising a reflecting film provided via the first insulating film on the side face of the semiconductor layer.

11. The device according to claim 10, wherein the film is provided between an end portion of the reflecting film and the optical layer.

12. The device according to claim 1, wherein
the first insulating film and the film are an inorganic film, and
the second insulating film is a resin.

13. The device according to claim 1, wherein the film is a silicon oxide film.

14. The device according to claim 1, wherein
a planar shape of the first side of the semiconductor layer is formed as a polygon, and
the film is provided corresponding to each side of the polygon.

15. The device according to claim 1, further comprising a second film provided between the first side of the semiconductor layer and the optical layer.

16. The device according to claim 15, wherein the second film is an inorganic insulating film.

17. The device according to claim 1, wherein the optical layer is provided on the first side of the semiconductor layer without via a substrate.

18. The device according to claim 10, wherein the second insulating film covers the reflecting film.

19. The device according to claim 6, wherein the first interconnect layer and the second interconnect layer include an aluminum film.

20. The device according to claim 10, wherein the reflecting film includes an aluminum film.

* * * * *